United States Patent
Najafi et al.

(10) Patent No.: US 10,263,173 B2
(45) Date of Patent: Apr. 16, 2019

(54) MULTI-AXIS PIEZOELECTRIC TRANSDUCER

(71) Applicant: THE REGENTS OF THE UNIVERSITY OF MICHIGAN, Ann Arbor, MI (US)

(72) Inventors: Khalil Najafi, Ann Arbor, MI (US); Ethem Aktakka, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 508 days.

(21) Appl. No.: 14/997,496

(22) Filed: Jan. 16, 2016

(65) Prior Publication Data
US 2016/0211439 A1 Jul. 21, 2016

Related U.S. Application Data

(60) Provisional application No. 62/104,208, filed on Jan. 16, 2015.

(51) Int. Cl.
*H01L 41/09* (2006.01)
*H01L 41/113* (2006.01)
(Continued)

(52) U.S. Cl.
CPC ...... *H01L 41/0825* (2013.01); *H01L 41/0946* (2013.01); *H01L 41/0953* (2013.01);
(Continued)

(58) Field of Classification Search
CPC ............. H01L 41/0825; H01L 41/0946; H01L 41/0953; H01L 41/1136; H02N 2/0095; H02N 2/188
(Continued)

(56) References Cited

U.S. PATENT DOCUMENTS 5,705,878 A * 1/1998 Lewis .................. H02N 2/028
310/328
6,501,210 B1 * 12/2002 Ueno .................... B23Q 1/34
310/330
(Continued)

FOREIGN PATENT DOCUMENTS

CA       2681173 A1    9/2008
EP       0869367 A1 *  7/1988   ............. G01P 15/00
WO   WO-2006046989 A1 *  5/2006   ............ H01L 41/113

*Primary Examiner* — Thomas M Dougherty
(74) *Attorney, Agent, or Firm* — Harness, Dickey & Pierce, P.L.C.

(57) ABSTRACT

A multi-axis transducer is provided. The transducer includes: a stationary member; at least two connecting members and two or more energy-conversion elements disposed on each connecting member. Each connecting member is attached at one location thereof to one of the stationary member or a second connecting member and, in response to a stimuli, is free to move along any of three geometric axes that are perpendicular to each other. Each energy-conversion element operates to convert motion of the connecting member to electrical energy or vice versa. A common geometric plane passes through each of the at least two connecting members and the stationary member, and the two largest dimensions of each connecting member defines a geometric plane that is parallel with the common geometric plane.

33 Claims, 14 Drawing Sheets

(51) Int. Cl.
*H01L 41/053* (2006.01)
*H01L 41/047* (2006.01)
*H01L 41/08* (2006.01)
*H02N 2/00* (2006.01)
*H02N 2/18* (2006.01)

(52) U.S. Cl.
CPC ....... *H01L 41/1136* (2013.01); *H02N 2/0095* (2013.01); *H02N 2/188* (2013.01)

(58) Field of Classification Search
USPC ........ 310/312, 339, 311, 328, 330–332, 345, 310/348, 351, 353
See application file for complete search history.

(56) References Cited

U.S. PATENT DOCUMENTS

| | | | |
|---|---|---|---|
| 7,649,305 B2 | 1/2010 | Priya et al. | |
| 8,354,778 B2 | 1/2013 | Arnold et al. | |
| 8,680,752 B2 | 3/2014 | Ayazi et al. | |
| 2006/0290236 A1* | 12/2006 | Ikehashi | G01C 19/5719 310/330 |
| 2009/0212665 A1* | 8/2009 | Koser | B60C 23/0411 310/339 |
| 2010/0045241 A1 | 2/2010 | Nousiainen | |
| 2012/0291547 A1* | 11/2012 | Kim | G01C 19/5755 73/504.12 |
| 2013/0208330 A1* | 8/2013 | Naono | G02B 26/10 359/200.1 |
| 2015/0288299 A1* | 10/2015 | Park | H01L 41/1136 310/319 |
| 2016/0245667 A1* | 8/2016 | Najafi | G01C 19/5783 |

\* cited by examiner

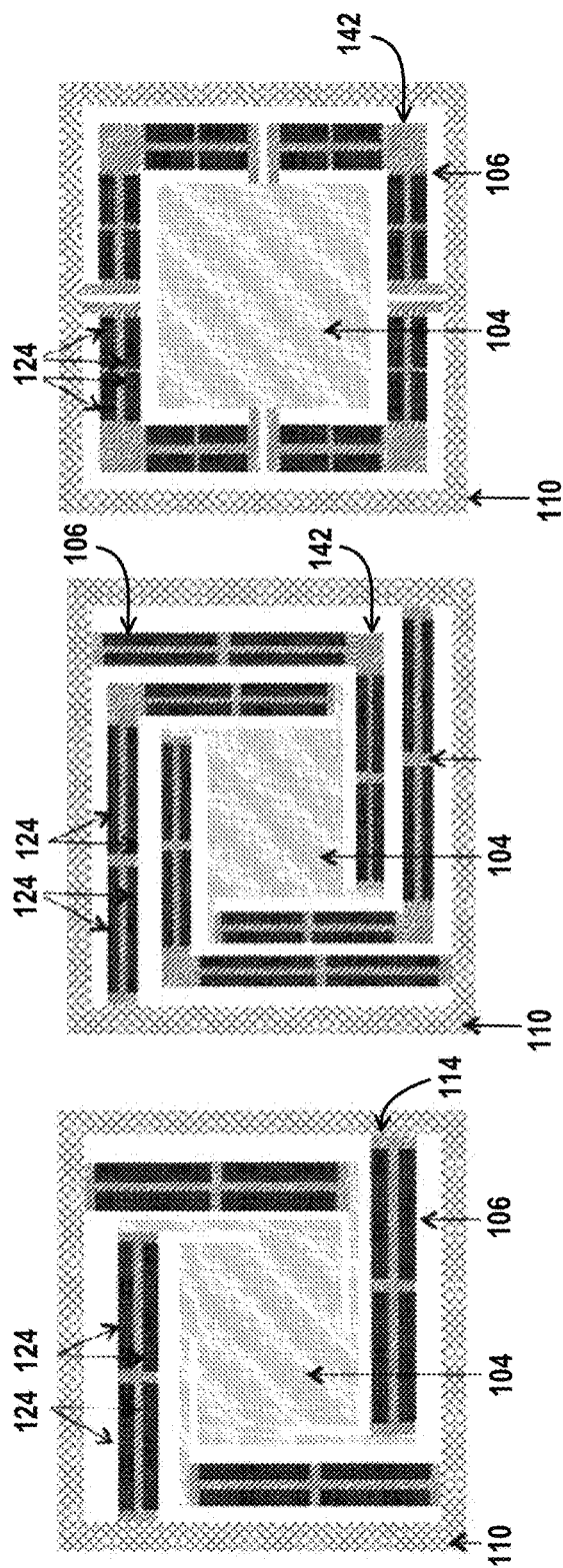

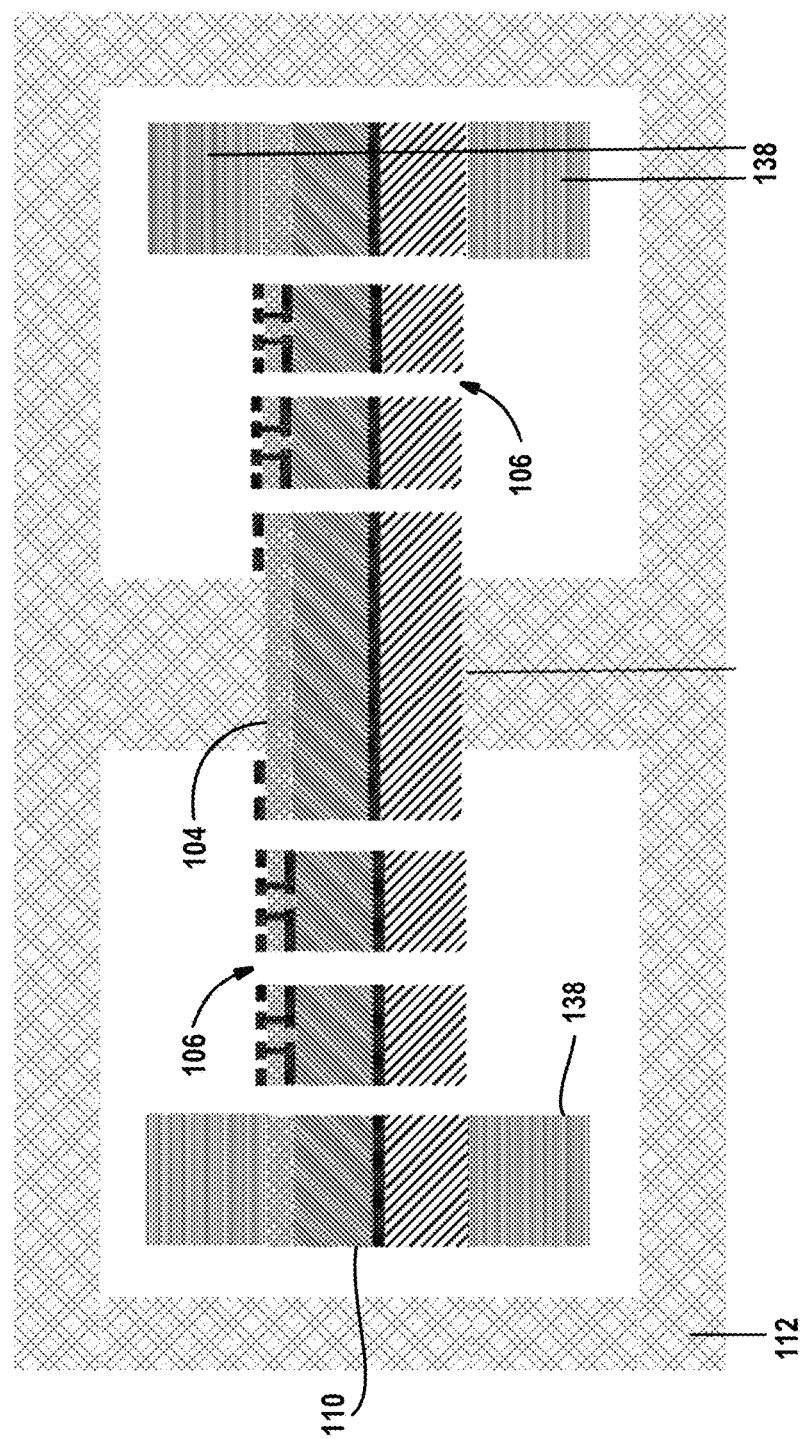

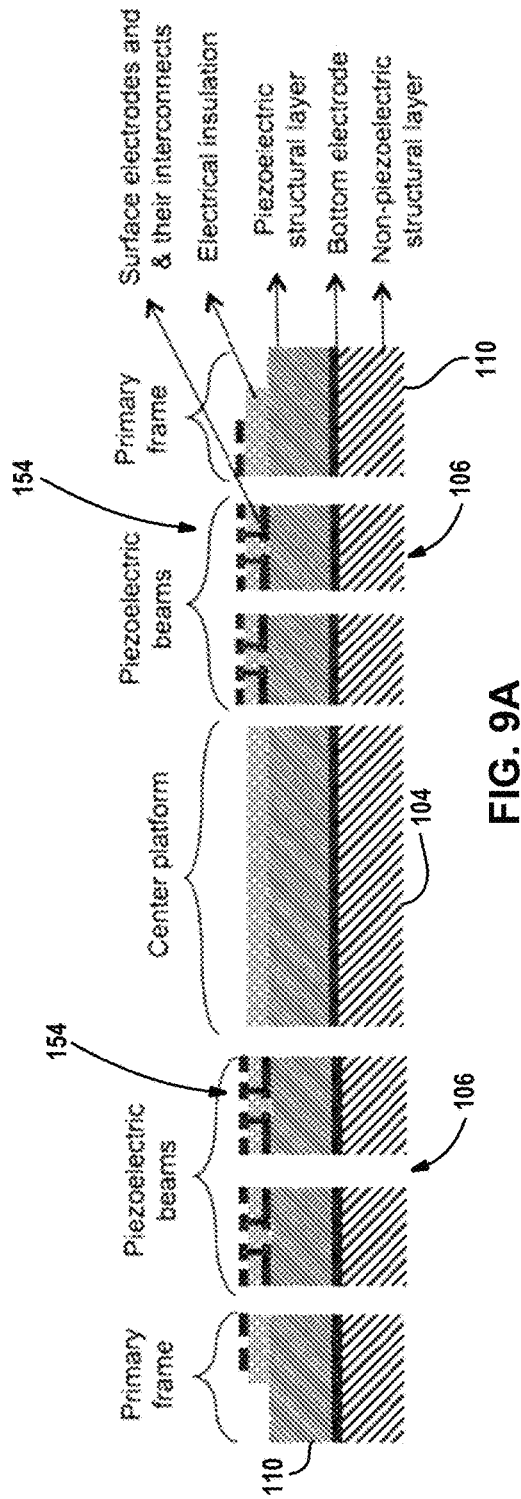
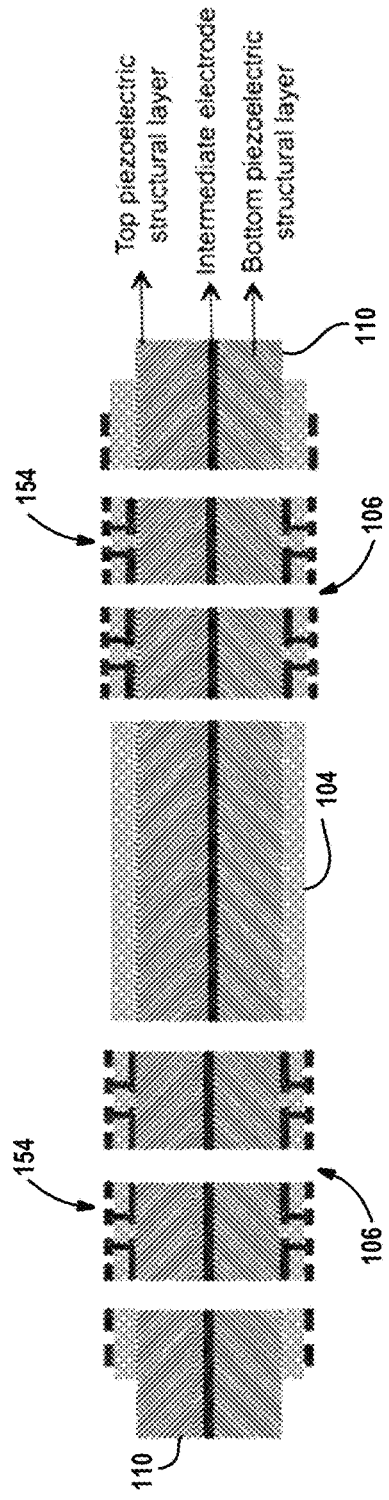
FIG. 9A
FIG. 9B

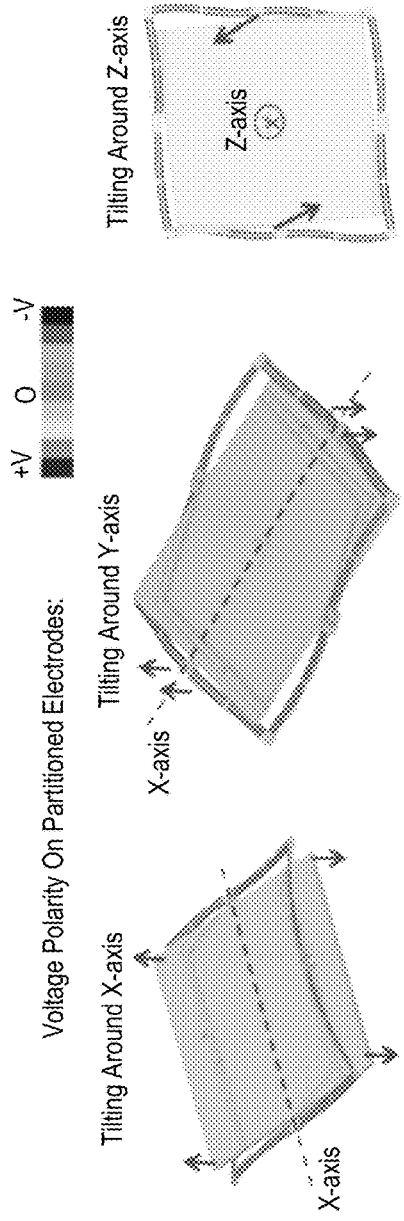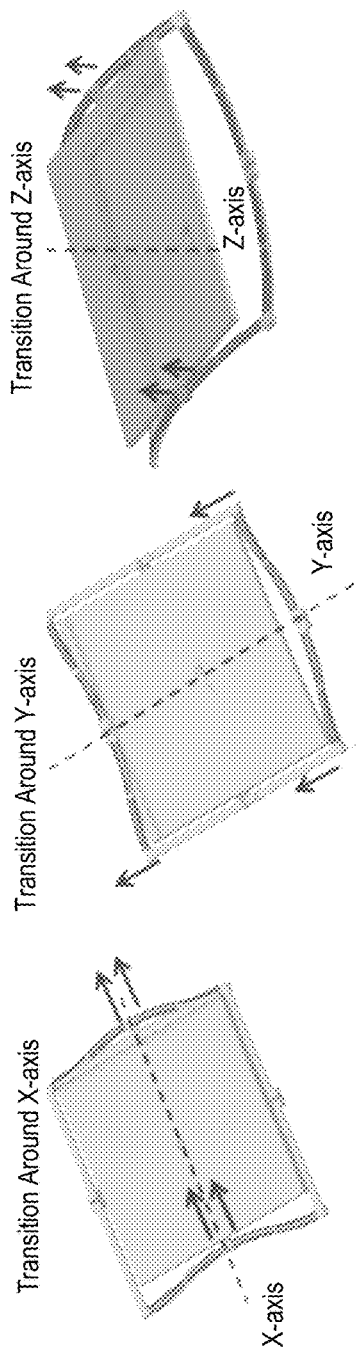
FIG. 11A — Tilting Around X-axis
FIG. 11B — Tilting Around Y-axis
FIG. 11C — Tilting Around Z-axis
FIG. 11D — Transition Around X-axis
FIG. 11E — Transition Around Y-axis
FIG. 11F — Transition Around Z-axis
Voltage Polarity On Partitioned Electrodes: +V, 0, -V

MULTI-AXIS PIEZOELECTRIC TRANSDUCER

CROSS-REFERENCE TO RELATED APPLICATIONS

This application claims the benefit of U.S. Provisional Application No. 62/104,208 filed Jan. 16, 2015. The entire disclosure of the above application is incorporated herein by reference.

GOVERNMENT CLAUSE

This disclosure was made with government support W31P4Q-12-1-0002 awarded by the US Army/AMC. The Government has certain rights in this disclosure.

FIELD

The present disclosure relates to a multi-axis piezoelectric transducer.

BACKGROUND

Inertial energy harvesting from ambient mechanical vibrations is a promising technology to enable next-generation wireless sensor nodes, which are self-powered, maintenance free, and thus truly autonomous. There have been a large number of micro and meso scale inertial harvesters reported up to date. Most can only operate at a single vibrational axis. Harvesting electrical energy from vibrations applied along any spatial direction can both improve their power output and extend the practical applications. One way to achieve this goal is by using three individual harvesters aligned along the three different axes assembled in a single package. This will, however, decrease the total power density and increase the overall cost due to the enlarged device size. Previously, single-transducer three-axis energy harvesters were reported only for electrostatic and electromagnetic resonators, although with very limited performance in terms of power output (16-25 nW) and power density (<125 nW/cm3/g2), resonance frequency (1.5-25 kHz), and frequency split (100-1000 Hz). Until now, only two-axis piezoelectric inertial harvesters have been reported, based on configurations such as asymmetric inertial mass, multiple mass-spring combinations, three-dimensional connecting member design, permanent-magnet and ball-bearing combination, and non-linear motion of a circular cantilever rod due to surrounding permanent magnet architecture. In addition to the limited number of operational axes, the architectures used in these devices require mostly three-dimensional structures with manual assembly, which prevent further device miniaturization. The present disclosure describes a piezoelectric transducer that can harvest electricity from mechanical energy in all three vibrational axes.

This section provides background information related to the present disclosure which is not necessarily prior art.

SUMMARY

This section provides a general summary of the disclosure, and is not a comprehensive disclosure of its full scope or all of its features.

In one form, the present disclosure provides a multi-axes transducer that includes a frame defining an inner space. A platform and a plurality of connecting members are disposed within the inner space. The connecting members are arranged around the platform. The connecting members, in response to stimuli, allow for movement of either the platform or the frame in any of three geometric axes, when the geometric axes are perpendicular to each other. Each of the connecting members has a first end and a second end. The first end is attached to the platform. The second end may be attached to the frame or to a secondary moveable frame.

Each connecting member is elastic and may be a shaped as a single beam. Alternatively, the connecting member may have a U-shape or L-shape when viewed top-down. Each connecting member is formed of at least one piezoelectric material. Additionally, each connecting member may include a second piezoelectric material or a non-piezoelectric material. The connecting members may have a rectangular cross-section. Alternatively, the connecting members may have a T-shape cross-section. Each connecting member has a first surface opposing a second surface. A plurality of surface electrodes is disposed on the first surface of each connecting member.

The plurality of partitioned surface electrodes contains a first group of partitioned surface electrodes and a second group of partitioned surface electrodes. The first group of partitioned surface electrodes may complete one of the following functions: harvesting electrical energy resulting from mechanical motion of a moveable section, sensing the motion of the multiple of connecting members or the moveable section by collecting charge, and applying voltage to actuate the moveable section. The second group of partitioned surface electrodes may complete one of the following functions that is different than function of the first group of partitioned surface electrodes: harvesting electrical energy resulting from mechanical motion of a moveable section, sensing the motion of the multiple of connecting members or the moveable section by collecting charge, and applying voltage to actuate the moveable section that is differs from the first group of partitioned surface electrodes.

Either a single surface electrode or a set of surface electrodes is disposed on the second surface of each connecting member. A common geometric plane passes through each of the plurality of connecting members, the frame, and the mass. The two largest dimensions of one of the plurality of connecting members define a geometric plane that is parallel to the common geometric plane.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1A is a top-down view of an exemplary multi-axis transducer having a single beam shaped connecting members;

FIGS. 1B and 1C are top-down views of exemplary multi-axis transducers having a L-shaped connecting members;

FIG. 3 is a cross-sectional side view of an exemplary multi-axis transducer having a stationary casing attached to a platform;

Figure 4A:
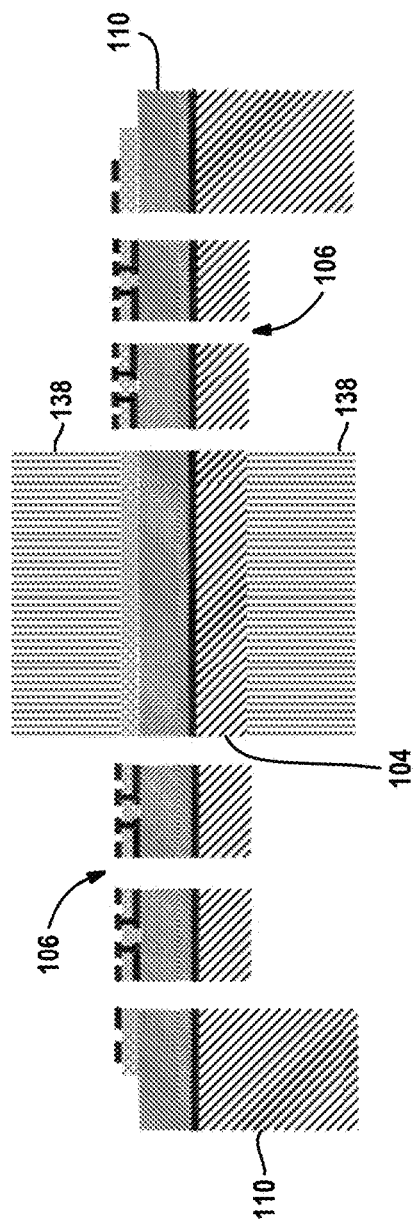
Figure 4B:
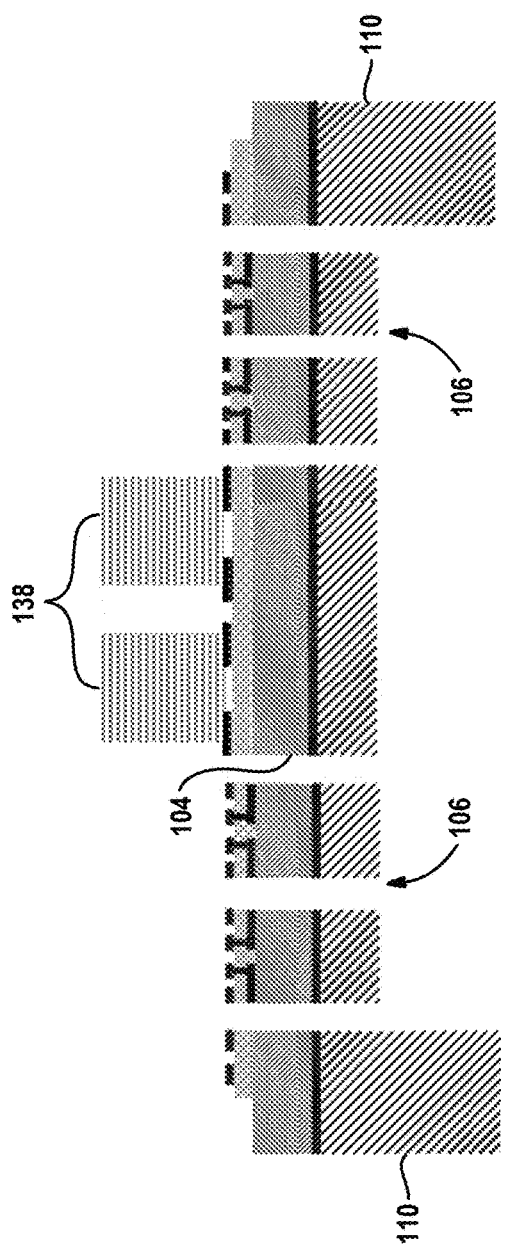
Figure 5A:
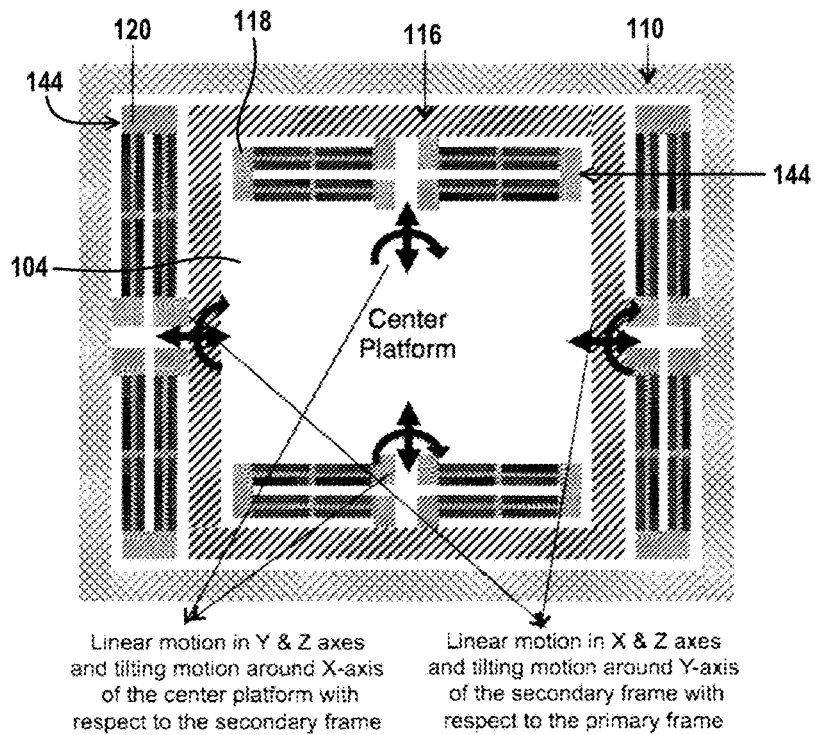
Figure 5B:
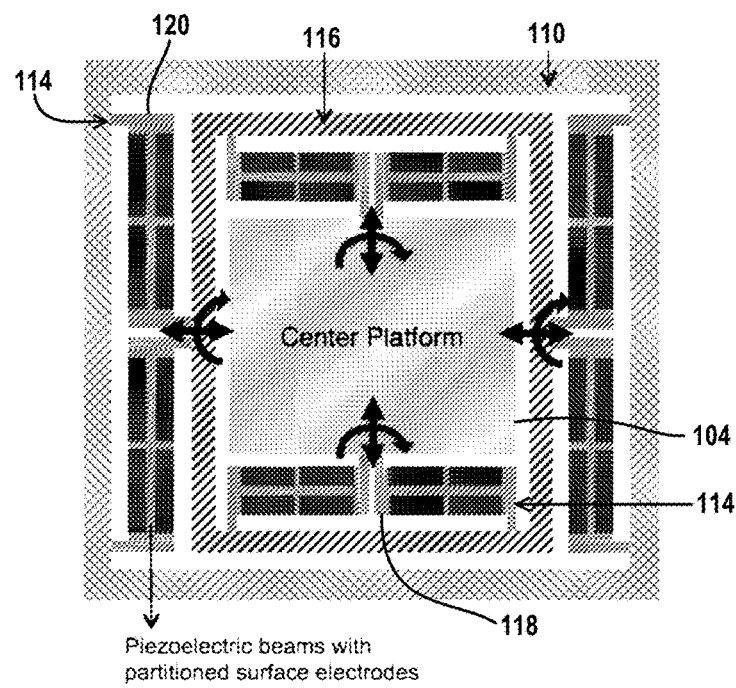
Figure 7:
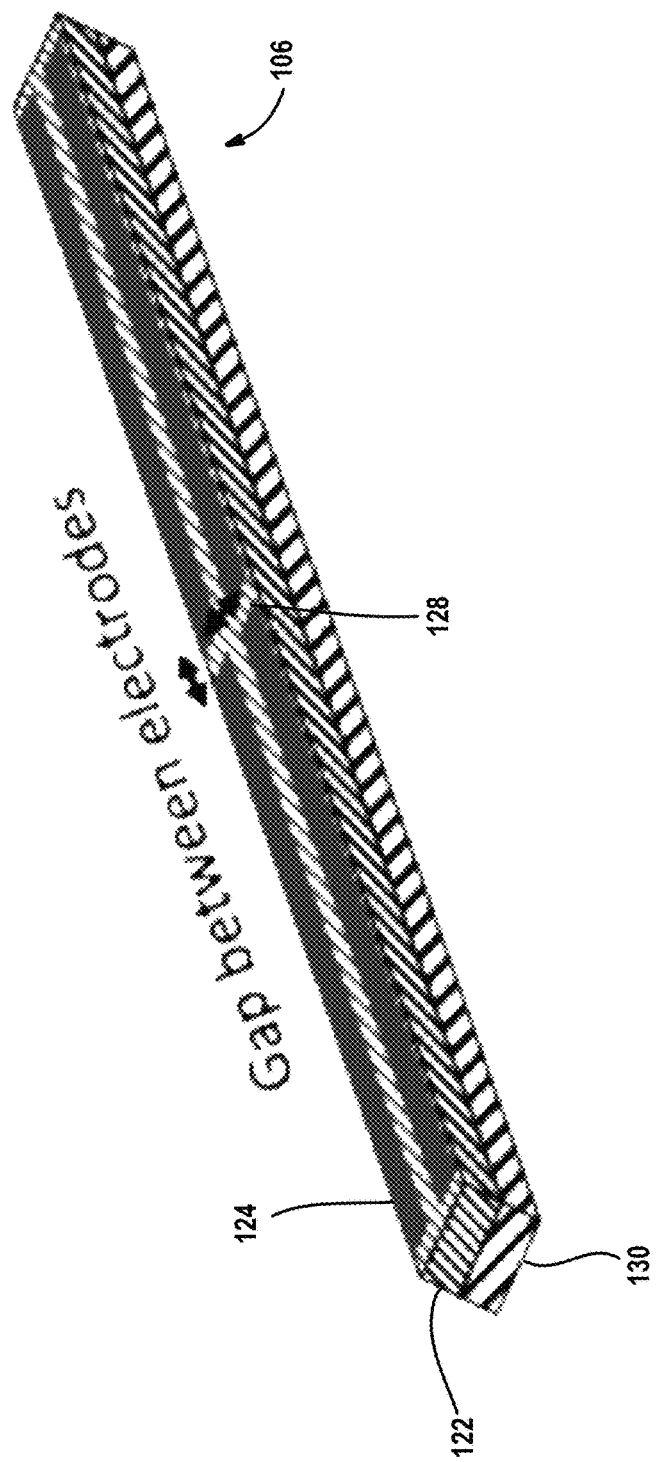

FIG. 4A-B are cross-sectional views of exemplary multi-axis transducers with additional members FIG. 5A is a top-down view of an exemplary multi-axis transducer having a secondary frame and U-shaped connecting members;

FIG. 5B is a top-down view of an exemplary multi-axis transducer having a secondary frame and single beam shaped connecting members;

FIGS. 6A-D are top-down views of exemplary connecting members;

FIG. 7 is a perspective side-view of an exemplary connecting member;

FIGS. 8A-F are cross-sectional views of exemplary connecting members;

FIG. 9A-D are cross-sectional views of exemplary multi-axis transducers;

FIG. 10A-F depicts the six-degrees of freedom motional flexibility of an exemplary multi-axis piezoelectric vibration energy harvester;

FIG. 11A-F depicts the different voltage polarities on the partitioned surface electrodes with respect to a common ground electrode when it is excited in six degrees-of-freedom motion by either a mechanical or electrical stimulus; and FIG. 12A-I depicts a method of fabrication for the described multi-axis transducer.

Corresponding reference numerals indicate corresponding parts throughout the several views of the drawings.

DETAILED DESCRIPTION

Example embodiments will now be described more fully with reference to the accompanying drawings.

The present disclosure describes a multi-axis piezoelectric transducer for scavenging or sensing of vibrational energy in all three dimensions. Specifically, the disclosure describes a three-axis piezoelectric vibration energy harvester for scavenging or sensing of vibrational energy in all three dimensions by leveraging a multi-axis piezoelectric transduction scheme. In addition to harvesting vibrational energy, the introduced multi-axis transducer can be utilized as an inertial sensor (such as an accelerometer), a force sensor, or an actuator with enhanced functionality and increased number of degree-of-freedoms. Moreover, the presently described multi-axis transducer can simultaneously be used in both harvesting and sensing (or actuation) modes, when different motional axes are utilized for each function. Thus, advantageously, the multi-axis device can be used to simultaneously sense the frequency (and possibly amplitude) of the ambient vibration, excite the multi-axis transducer to adjust its resonance frequency to match the dominant vibration frequency, and harvest ambient vibrational energy with higher transduction efficiency.

Moreover, the multi-axis transducer when used as an energy harvester or a motion sensor provides signal transduction capability from both linear and angular motions in all three dimensions in a single unit. The enabled multi-axis operation in a single device can replace the use of multiple single-axis devices that have been traditionally necessary to obtain the same functionality. Thus, the features of the described multi-axis device allow for significant savings in the device footprint and fabrication costs. The described multi-axis transducer can be utilized as an energy supply unit in many applications including wireless sensor nodes, wearable electronics, and portable electronics.

Figure 1E:
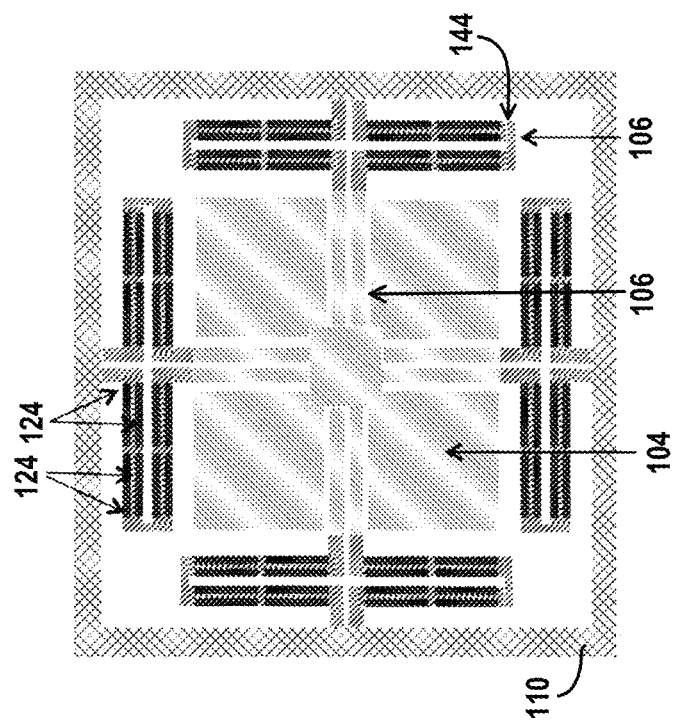
FIGS. 1D and 1E are top-down views of exemplary multi-axis transducers having a U-shaped connecting members.
Figure 1D:
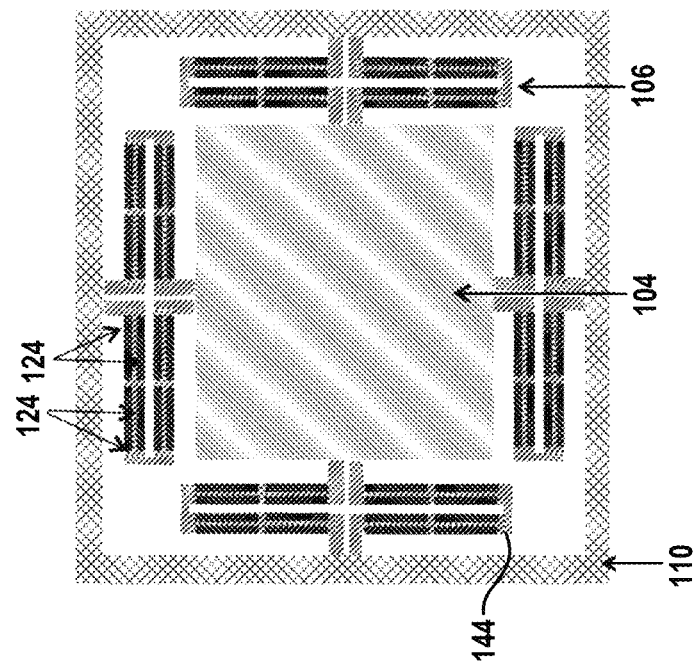
Figure 2:
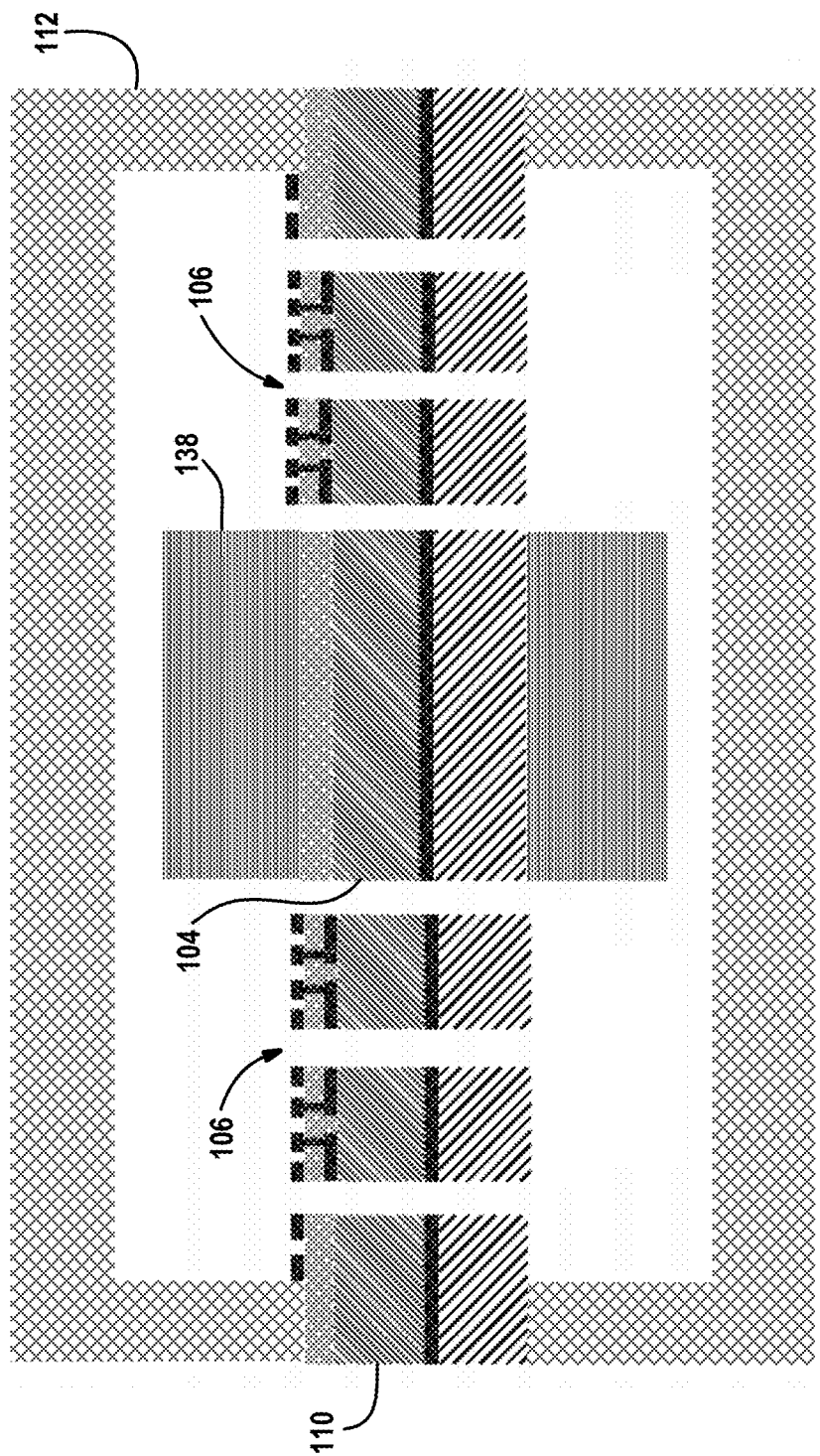
FIG. 2 is a cross-sectional side view of an exemplary multi-axis transducer having a stationary casing attached to a primary frame.

With reference to FIGS. 1A-F, 2, 3, 4A-B, and 5A-B exemplary multi-axis transducers 100 are shown. A multi-axis transducer 100 comprises a platform 104, a primary frame 110, and at least two connecting members 106. A common geometric plane passes through each of the platform 104, the primary frame 110, and the connecting members 106, as best seen in FIGS. 2 and 3. The two largest dimensions of one of the plurality of connecting members define a geometric plane that is parallel to the common geometric plane.

The primary frame 110 defines an inner portion 102. The platform 104 and the connecting members 106 are disposed within the inner portion 102. The platform 104 may be a mass member. The connecting member 106 may be a piezoelectric beam or a mechanical spring. The connecting members 106 are arranged around the platform 104. For example, the connecting members 106 may be arranged symmetrically around the platform 104, as best seen in FIGS. 1A-1D. Alternatively, the connecting members 106 may be arranged asymmetrically around the platform 104 (not shown). Additionally, as seen in FIG. 1E, there may be additional connection members 106 interacting with the platform 104 to increase in-plane flexibility.

As seen in FIGS. 1A and 1B, the connecting members 106 may have a single beam shape 114. Alternatively, as seen in FIGS. 1B and 1C, the connecting members 106 may have a top-down "L" shape 142. Alternatively, as seen in FIGS. 1D, 1E, and 5A, the connecting members 106 may have a top-down "U" shape 144. The L-shape 142 and U-shape 144 enable balanced multi-axis motion of the platform 104 and the primary frame 110 along different axes. The L-shape 142 and U-shape 144 also allow for in-plane relaxation of any residual stress resulting from temperature variations. However, in other embodiments the connecting members 106 may take the form of other shapes, which allow for the same or additional functions.

The connecting members 106, in response to stimuli, allow for movement of either the platform 104 or the primary frame 110 in any of three geometric axes, when the geometric axes are perpendicular to each other. The connecting members 106 respond to mechanical or electric stimulus, which creates a stress or strain on at least one of the plurality of the connecting members 106.

With reference to FIGS. 2 and 3, the multi-axis transducer 100 may further comprise a stationary casing 112. In an example embodiment, the stationary casing 112 is a housing for multi-axis transducer 100. The stationary casing 112 is used to provide environmental protection to the multi-axis transducer 100. The stationary casing 112 also provides a means to mechanically handle and attach the multi-axis transducer 100 to a fix location during its operation.

As seen in FIG. 2, the primary frame 110 may be fixed in position by attachment to a stationary casing 112, while the platform 104 is free of any attachment to the stationary casing 112. In such instances, the primary frame 110 forms a fixed, anchored, or stationary section or member of the multi-axis transducer 100, and the platform 104 forms the moveable section or member of the multi-axis transducer 100.

Alternatively, as seen in FIG. 3, the platform 104 may be fixed in position by attachment to the stationary casing 112, while the primary frame 110 is left free of any attachment to the stationary casing. In such instances, the platform 104 forms the fixed, anchored, or stationary section or member of the multi-axis transducer 100, and the primary frame 110 forms the moveable section or member of the multi-axis transducer 100.

In both instances, the stationary casing 112 may be attached to the platform 104 or the primary frame 110 through use of an intermediate adhesive, for example, glue, epoxy bonding, polymer bonding, or eutectic bonding. Alternatively, the stationary casing 112 may be attached to the platform 104 or the primary frame 110 through direct bonding of the components, for example through soldering, anodic bonding, or injection molding.

With respect still to FIGS. 2 and 3, and with additional respect to FIGS. 4A-B, the multi-axis transducer 100 may further comprise one or more additional members 138. The multi-axis transducer 100 can be operated with or without the additional members 138. In FIGS. 1A-E and 5A-B, the multi-axis transducer 100 is seen without additional members 138.

Additional members 138 may be attached or monolithically integrated on the bottom surface, top surface, or both surfaces of the primary frame 110. For example, in FIG. 3, a multi-axis transducer 100, having a stationary casing 112, is seen with additional members 138 attached or monolithically integrated on both the top and bottom surfaces of the primary frame 110.

Similarly, additional members 138 may be attached or monolithically integrated on the bottom surface, top surface, or both surfaces of the platform 104. For example, in FIG. 2, a multi-axis transducer 100, having a stationary casing 112, is seen with additional members 138 attached or monolithically integrated on both the top and bottom surfaces of the platform 104. In FIG. 4A, a multi-axis transducer 100, not having a stationary casing 112, is seen with additional members 138 attached or monolithically integrated on both the top and bottom surfaces of the platform 104. In FIG. 4B, a multi-axis transducer 100, not having a stationary casing 112, is seen with additional members 138 attached or monolithically integrated on only the top surface of the platform 104.

The additional members 138 may be active or passive. The additional members 138 can be used to increase the inertial mass of the platform 104. For example, the attached or monolithically integrated additional members 138 may be formed from materials having a large mass density, such as tungsten, gold, or nickel. An increase in the inertial mass of the platform 104 reduces the first mode resonance frequency and increases the mechanical coupling of external vibrations into the multi-axis transducer 100. The increased mechanical coupling increases sensitivity of the multi-axis transducer 100 when used as an inertial sensor or as a vibration energy harvester. Alternatively, when active additional members 138 are attached or monolithically integrated on the top or bottom surface of the platform 104, as seen in FIGS. 2, 4A, and 4B, the electrical connections from the additional members 138 to the primary frame 110 can be integrated on to the connecting members 106. Through these electrical connections, the active additional members 138 can be controlled as a sensor, an actuator, an electronic circuit, or an energy reservoir.

With reference to FIGS. 5A-B, the multi-axis transducer 100 may further comprise a secondary frame 116. In such instances, a first set of connecting members 118 attaches the platform 104 to the secondary frame 116, and a second set of connecting members 120 attaches the secondary frame 116 to the primary frame 110. The secondary frame 116 enables different in-plane vibrational modes to be distributed between the first set of connecting members 118 and the second set of connecting members 120.

The first set of connecting members 118 may have a single beam shape 114, a U-shape 144, or a L-shape 142. Similarly, the second set of connecting members 120 may have a single beam shape 114, a U-shape 144, or a L-shape 142. For example, in FIG. 5A both the first set of connecting members 118 and the second set of connecting members 120 have a U-shape 144 (similarly to FIGS. 1D and 1E). In FIG. 5B, both the first set of connecting members 118 and the second set of connecting members 120 have a single beam shape 114 (similarly to FIG. 1A). It is understood that the shape of the first set of connecting members 118 and the shape of the second set of connecting members 120 need not correspond. Additionally, as with respect to FIGS. 1A-E, it is understood that the first set of connecting members 118 and the second set of connecting members 120 may take shapes other than a single beam shape 114, a U-shape 144, or a L-shape 142.

With reference to FIGS. 6A-D, exemplary connecting members 106 are shown. Each connecting member 106 has a first end 134 and a second end 136. The first end 134 is attached to the platform 104. The second end 136 is attached to the primary frame 110. In the instance of a multi-axis transducer 100 having a secondary frame 116, as seen in FIGS. 5A-B, the first end 134 of the first set of connecting members 118 is attached to the platform 104, and the second end 136 of the first set of connecting members 118 is attached to the secondary frame 116. Similarly, the first end 134 of the second set of connecting members 120 is attached to the secondary frame 116, and the second end 136 of the second set of connecting members 120 is attached to the primary frame 110.

Figure 6A:
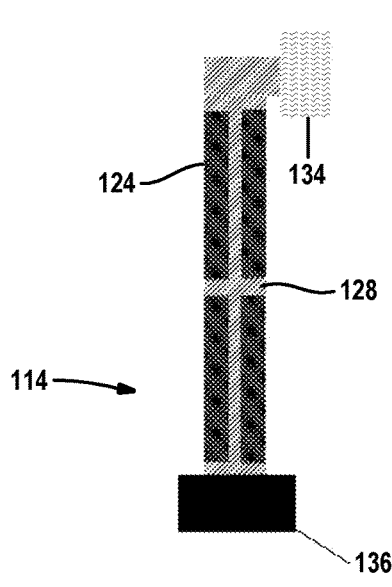
Figure 6B:
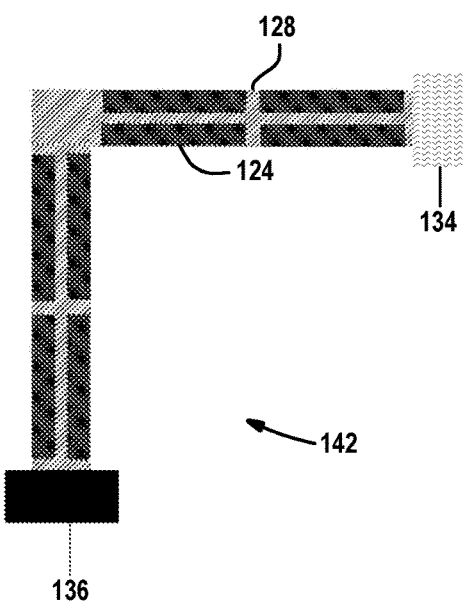
Figure 6C:
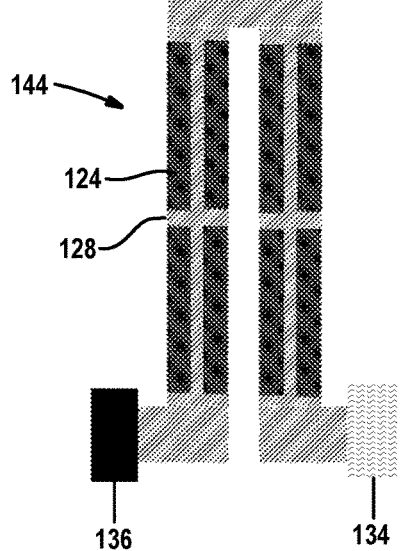
Figure 6D:
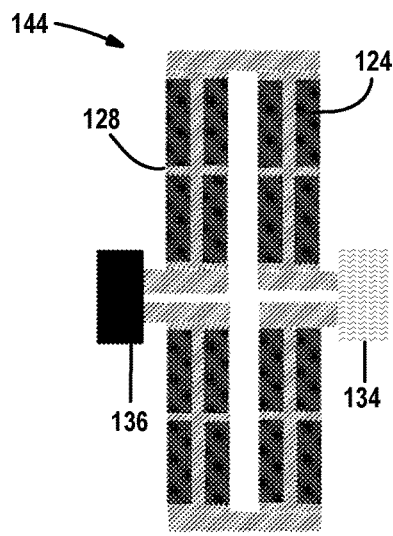

As discussed above, specifically in reference to FIGS. 1A-E and 5A-B, the connecting members 106 may have a single beam shape 114, a U-shape 144, or a L-shape 142. FIG. 6A depicts a connecting member 106 having a single beam shape 114. FIG. 6B depicts a connecting member 106 having a L-shape 142. FIGS. 6C and 6D depict connecting members 106 having a U-shape 144. In other embodiments, the connecting members 106 may take shapes other than the single beam shape 114, the U-shape 144, or the L-shape 142.

Figure 8A:
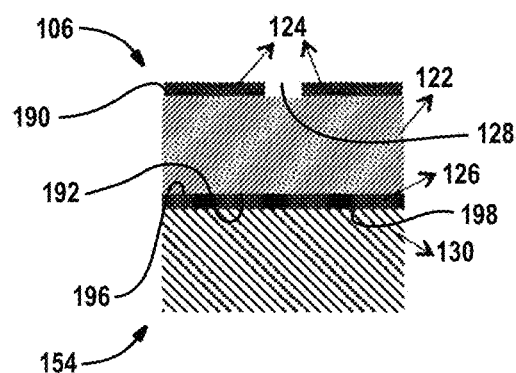
Figure 8B:
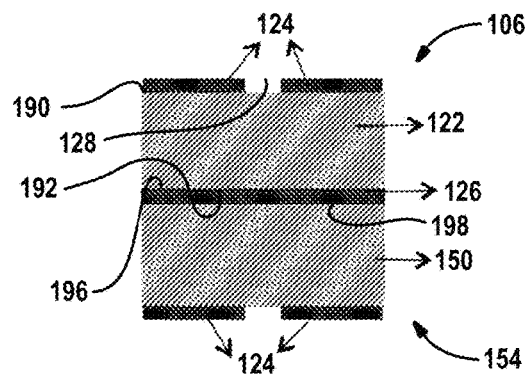
Figure 8C:
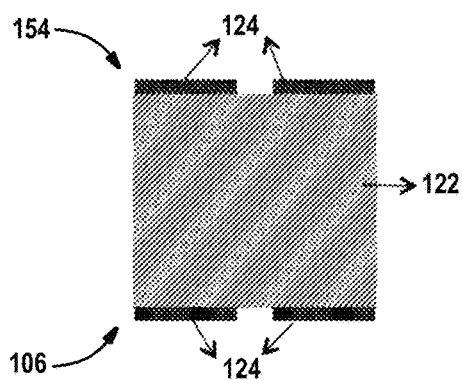
Figure 8D:
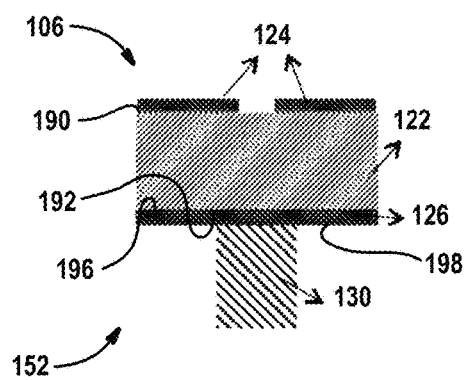

With reference to FIGS. 8A-F, cross-sections of exemplary connecting members 106 are shown. Each connecting member 106 generally includes at least one piezoelectric material 122 and a plurality of partitioned surface electrodes 124 separated by a gap 128. The piezoelectric material 122 has a first surface 190 of the piezoelectric material 122 opposing a second surface 192 of the piezoelectric material 122. The plurality of partitioned surface electrodes 124 covers the first surface 190 of the piezoelectric material 122. The second surface 192 of the piezoelectric material 122 may be covered with a single surface electrode 126 (as seen in FIGS. 8A, 8B, and 8D) or a second set of partitioned surface electrodes 194 (as seen in FIGS. 8C and 8D). The platform 104 and the primary frame 110 may be formed similarly to or different from the connecting members 106.

The single surface electrode 126 has a first surface 196 of the single surface electrode 126 opposing a second surface 198 of the single surface electrode 126. The first surface 196 of the single surface electrode 126 faces the second surface 192 of the piezoelectric material 122. The single surface electrode 126 is used as a common ground. Use of a single surface electrode 126 on both sides of the piezoelectric material 122 would allow only for the harvest or energy or sense motion from out-of-phase vibrations.

The partitioned surface electrodes 124 enables energy transduction along all three vibrational axes of the multi-axis transducer 100. The partitioned surface electrodes 124 may be used to harvest electrical energy resulting from mechanical strain on the connecting members 106, to sense the amplitude and direction of mechanical strain on the connecting members 106 by measuring the electrical signal, and for creating mechanical strain on the connecting members 106 by applying an electrical signal.

The plurality of partitioned surface electrodes 124 may include a first group of partitioned surface electrodes and a second group of partitioned surface electrodes. The first group of partitioned surface electrodes may complete one of the following functions: harvesting electrical energy resulting from mechanical motion of a moveable section; sensing the motion of the multiple of connecting members 106 or the moveable section by collecting charge; and applying voltage to actuate the moveable section. The second group of partitioned surface electrodes may complete one of the following functions that is different than function of the first group of partitioned surface electrodes: harvesting electrical energy resulting from mechanical motion of a moveable section; sensing the motion of the multiple of connecting members 106 or the moveable section by collecting charge; and applying voltage to actuate the moveable section that is differs from the first group of partitioned surface electrodes. In some embodiments the function of the first group of partitioned surface electrodes may be the same as the function of the second group of partitioned surface electrodes. In other embodiments the functions of the first group of partitioned surface electrodes may be different from the second group of partitioned surface electrodes.

In some embodiments, the multi-axis transducer 100 may have a third group of partitioned surface electrodes integrated on the surface of one or more of the connecting member 106 or the moveable section (not shown). The third group of partitioned surface electrodes allows the inertial motion of the moveable section to be determined. Alternatively, there may be an external group of partitioned surface electrodes on a stationary plate adjacent the multi-axis transducer 100 (not shown). The inertial motion of the moveable section may be determined by measuring the capacitance change between the third group of partitioned surface electrodes and the external partitioned surface electrodes existing on the adjacent stationary plate.

The partitioned surface electrodes 124 may be used to harvest energy from both angular and linear motion in both out-of-plane and in-plane directions. Additionally, the platform 104 may be actuated by applying voltages with different polarities on the partitioned surface electrodes 124 to create a transverse piezoelectric mode (31-mode) excitation in the connecting member 106. If the partitioned surface electrodes 124 are shaped into interdigitated fingers (not shown), the connecting member 106 can be utilized in a lateral piezoelectric mode (33-mode) for the same purposes of actuation, harvesting, or sensing. Compared to the transverse piezoelectric mode, the lateral piezoelectric mode provides a higher voltage output from the energy harvester. The higher voltage results because the $d_{33}$ coefficient of the piezoelectric material is greater than the $d_{31}$ coefficient of the piezoelectric material, however the power output of the device would be slightly lower.

When the partitioned surface electrodes 124 are used for harvesting energy an interface circuitry may allow for rectification of the alternating current (AC) input electrical signal to a direct current (DC) electrical signal in its output. The harvesting circuitry may be formed of a combination of multiple stages. For example only, the harvesting circuitry may include a rectification stage, a regulation stage, a capacitor-inductor network, a maximum power point tracking circuit, and an energy reservoir. In such instances, the rectification stage converts alternating current signal input to direct current signal input. The regulation stage (e.g. passive diodes, transistor switches, active diodes, etc.) defines the final voltage amplitude in the direct current output. The capacitor-inductor network (e.g. a bias flip stage) minimizes the reactive energy loss in the connecting member 106. The maximum power point tracking (MPPT) circuit defines the voltage amplitude on the alternating circuit signal input for achieving highest efficiency at different mechanical excitation levels. The energy reservoir allows for long-term storage of the harvested electrical energy in electrical (e.g. a capacitor), chemical (e.g. a battery), kinetic (e.g. a flywheel) energy forms or a combination of these methods (e.g. an ultra-capacitor).

When the partitioned surface electrodes 124 are used for mechanical motion or strain sensing, a basic electronic interface may include a buffer circuit, a charge amplifier, and a feedback network. In such instances, the buffer circuit isolates the noise between input and output terminals. The charge amplifier increases the output signal level with a constant or a variable gain. The feedback network measures the output signal component at a specific frequency.

When electrical excitation is applied to the partitioned surface electrodes 124 to create mechanical strain on the connecting member 106, a basic interface circuit may include an oscillator circuit, a frequency multiplier, a signal generator, a voltage or current amplifier, and a phase locked loop control circuit. In such instances, the oscillator circuit that provides an alternating circuit electrical signal. The frequency multiplier determines the exact frequency of the signal applied to the connecting member 106. The signal generator determines shape. The voltage or current amplifier determines the amplitude of the applied signal. The phase locked loop control circuit determines the phase of the applied signal.

A gap 128 exists between neighboring partitioned surface electrodes 124. The gap 128 minimizes possible dielectric breakdowns resulting from the different amplitudes and polarities of voltage harvested on the partitioned surface electrodes 124. The gap 128 may also limit the maximum strain on the connecting member 106 and provide greater structural reliability, when the partitioned surface electrodes 124 are excited at high electric fields (>500 V/mm) for actuation. However, the gap 128 may result in decreased energy transduction efficiency.

An optimum gap value is dependent upon the other dimensions of the connecting member 106, for instance the width and thickness of the piezoelectric material 122 within the connecting member 106. The optimum gap value may be determined through finite element simulations. For example, parametric simulation can be performed for varying gap values to determine the value where maximum power output is obtained for a vibrational input while the generated mechanical strain on the connecting member 106 is limited to less than 1%. The generated mechanical strain is limited as a precaution to prevent cracking resulting from high stress on the fragile piezoelectric ceramic and to minimize mechanical failures related to fatigue and that develop after the long-term use.

Some of the partitioned surface electrodes 124 may be used for transverse-mode piezoelectric actuation with applied electric fields as much as 1000 V/mm in the thickness direction. In such instances, the minimum gap 128 between the partitioned surface electrodes 124 may be greater than the thickness of the piezoelectric material 122 to prevent any dielectric breakdown resulting from generated lateral electric field between the partitioned surface electrodes 124.

The connecting members 106 may have a unimorph structure 146 (as seen in FIGS. 8A and 8D) or a bimorph structure 148 (as seen in FIG. 8B). The connecting members 106 having the bimorph structure 148 include a second piezoelectric material 150. The second piezoelectric material 150 faces the second surface 198 of the single surface electrode 126. The bimorph structure 148 provides greater harvesting efficiency and increased motion sensitivity. In the instance of actuation, the bimorph structure 148 provides a larger displacement amplitude.

The connecting members 106 having the unimorph structured 146 include a non-piezoelectric material 130. The non-piezoelectric material 130 faces the second surface 198 of the single surface electrode 126. A silicon material may be used as the non-piezoelectric material 130. Silicon is advantageous because it can be processed with standard microfabrication methods and its thermal coefficient of expansion (TCE) is close to the TCE values of some of the piezoelectric materials, such as lead zirconium titanate (PZT) or lead magnesium niobate-lead titanate (PMN-PT). In addition, silicon has a higher yield strength as compared to most of the piezoelectric ceramics. Thus, a laminated structure comprising silicon provides an improved mechanical durability of the connecting members 106 against external shocks or vibrations. However, the non-piezoelectric material 130 may be formed of other materials, including metals, ceramics, polymers, glass, or silica.

Figure 8E:
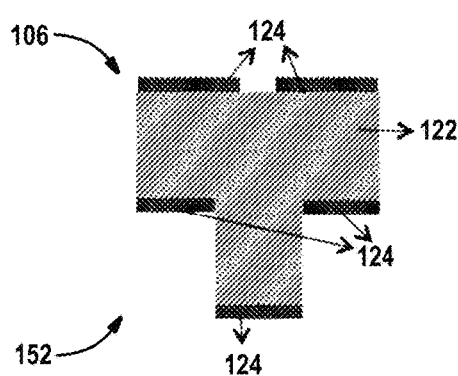
Figure 8F:
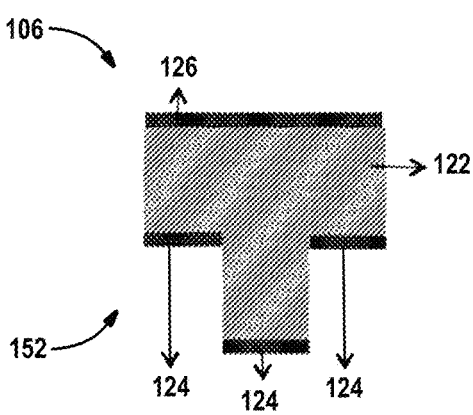

The connecting member 106 may have a rectangular cross-section 154 (as seen in FIGS. 8A-8C). In another embodiment, the connecting member 106 may have a T-shaped cross-section 152 (as seen in FIGS. 8D-8F). It is also readily understood that the connecting member 106 may have other cross-sectional shapes.

It is desirable to obtain the resonance frequencies of different vibration modes as close as possible, so that a single frequency band can be determined for the general operation of the multi-axis transducer 100. However, in micro and meso-scale resonators, the resonance frequencies of in-plane vibration modes are generally much higher than the out-of-plane resonance frequencies. The T-shaped cross-section 152 increases the in-plane motion flexibility of the multi-axis transducer 100.

The connecting member 106 having a T-shaped cross-section 152 may have a unimorph structure 146 (as seen in FIG. 8D), a bimorph structure 148 (not shown), or be formed of the single piezoelectric material 122 (as seen in FIGS. 8E and 8F). In instances of a connecting member 106 having a T-shaped cross-section 152 and a unimorph structure 146, the piezoelectric material 122 has a width greater than the width of the non-piezoelectric element 130. Use of a connecting member 106 having a T-shaped cross-section 152 and a unimorph structure 146 simplifies the microfabrication process and patterning of the partitioned surface electrodes 124.

In the instance of connecting members 106 having a unimorph structured 146 (as seen in FIGS. 8A and 8D), to obtain maximum energy transduction efficiency in the out-of-plane mode, the thickness ratio of the piezoelectric material 122 to the non-piezoelectric material 130 should be optimized. At this optimum thickness ratio, the centroid of the connecting member 106 is close to the boundary between the piezoelectric material 122 and non-piezoelectric material 130. When the thickness of the piezoelectric material 122 is fixed, the in-plane mechanical flexibility favorably increases as the width of the non-piezoelectric material 130 decreases to form the desired T-shaped cross-section 152. As the width of the non-piezoelectric material 130 decreases, the thickness of the non-piezoelectric material 130 increases to keep the centroid of the connecting member 106 adjacent the boundary between the non-piezoelectric material 130 and the piezoelectric material 122. As the thickness of the non-piezoelectric material 130 increases the out-of-plane flexibility decreases. However, an optimum thickness exists that allows similar flexibilities to be obtained for both the in-plane and out-of-plane vibrational modes.

In the connecting member 106 having a unimorph structured 146 (as seen in FIGS. 8A and 8D) to obtain the maximum power output from out-of-plane motion and to minimize the static beam deformation due to residual stress, the z-axis centroid of the connecting member 106 is kept close to the boundary between the piezoelectric material 122 and non-piezoelectric material 130. Such determines the optimum thickness ratio ($t_{Piezo}/t_{Passive}$) between the piezoelectric material 122 and non-piezoelectric material 130. The optimum thickness ratio depends on an elastic modulus (E) and width (W) of both the piezoelectric material 122 and non-piezoelectric material 130.

$$\frac{t_{Piezo}}{t_{Passive}} = \sqrt{\frac{E_{Passive} W_{Passive}}{E_{Piezo} W_{Piezo}}} \quad (1)$$

In the connecting member 106 having a T-shape cross-section 152, a unimorph structured 146, and a predetermined piezoelectric material 122 thickness, the in-plane flexural rigidity (EI) can be decreased by utilizing a smaller width in the non-piezoelectric material 130 ($W_{Passive}$) compared to the width of the piezoelectric material 122 ($W_{Piezo}$).

$$(EI)_{In-Plane} = \frac{E_{Piezo} t_{Piezo} W_{Piezo}^3}{12} \left(1 + \sqrt{\frac{E_{Passive} W_{Passive}^5}{E_{Piezo} W_{Piezo}^5}}\right) \quad (2)$$

However, a smaller $W_{Passive}$ value requires a thicker non-piezoelectric material 130 ($t_{Passive}$) to keep the centroid of the beam at the boundary of the non-piezoelectric material 130 and the piezoelectric material 122, which in turn increases the out-of-plane flexural rigidity.

$$(EI)_{Out-of-Plane} = \frac{E_{Piezo} W_{Piezo} t_{Piezo}^3}{3} \left(1 + \sqrt{\frac{E_{Piezo} W_{Piezo}}{E_{Passive} W_{Passive}}}\right) \quad (3)$$

However, an optimum value for $W_{Passive}$ may be determined where both in-plane (($EI)_{In-Plane}$) and out-of-plane (($EI)_{Out-of-Plane}$) motional flexibilities are maximized and the resonance frequencies of the related vibrational modes are placed as close to each other as possible.

FIG. 8A depicts a connecting member 106 having a rectangular cross-section 154 and a unimorph structure 146. FIG. 9A depicts a multi-axis transducer 100 having the connecting member 106 as depicted in FIG. 8A. Specifically, FIG. 8A depicts a connecting member 106 having a piezoelectric material 122 with a first surface 190 and an opposing a second surface 192, wherein the first surface is covered by a plurality of partitioned surface electrodes 124 separated by a gap 128. The second surface 192 of the piezoelectric material 122 is covered by a single surface electrode 126 having a first surface 196 of the single surface electrode 126 opposing a second surface 198 of the single surface electrode. The second surface 192 of the piezoelectric material 122 faces the first surface 196 of the single surface electrode 126. A non-piezoelectric material 130 faces the second surface 198 of the single surface electrode 126.

FIG. 8B depicts a connecting member 106 having a rectangular cross-section 154 and a bimorph structure 148. FIG. 9B depicts a multi-axis transducer 100 having the connecting member 106 as depicted in FIG. 8B. Specifically, FIG. 8B depicts a connecting member 106 having a piezoelectric material 122 with a first surface 190 and an opposing a second surface 192, wherein the first surface is covered by a plurality of partitioned surface electrodes 124 separated by a gap 128. The second surface 192 of the piezoelectric material 122 is covered by a single surface electrode 126 having a first surface 196 of the single surface electrode 126 opposing a second surface 198 of the single surface electrode. The second surface 192 of the piezoelectric material 122 faces the first surface 196 of the single surface electrode 126. A second piezoelectric material 150 faces the second surface 198 of the single surface electrode 126.

Figure 9C:
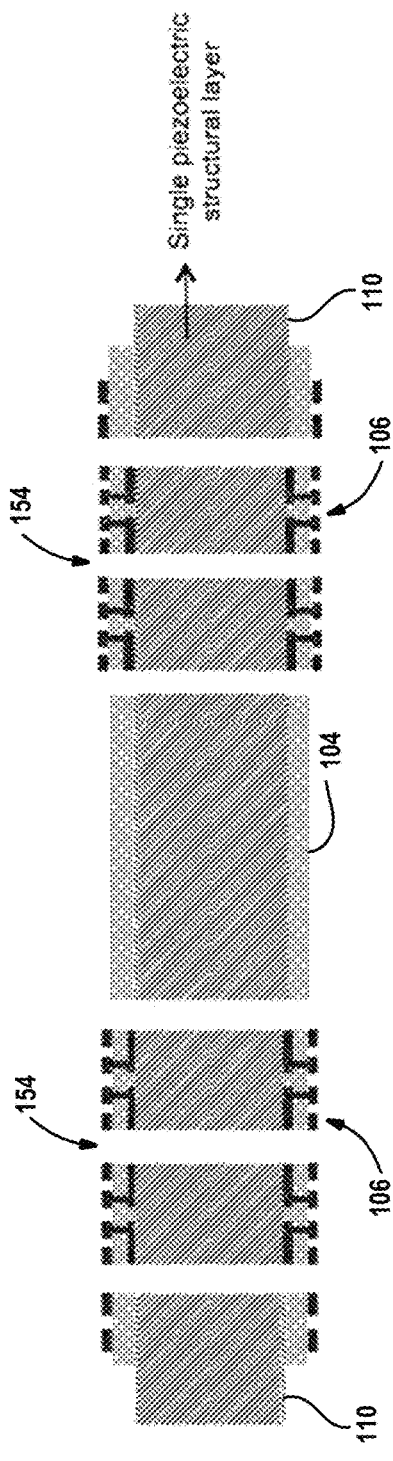

FIG. 8C depicts a connecting member 106 having a rectangular cross-section 154 and a single piezoelectric material 122. FIG. 9C depicts a multi-axis transducer 100 having the connecting member 106 as depicted in FIG. 8C. Specifically, the piezoelectric material 122 of FIG. 8C has a first surface 190 and an opposing a second surface 192. Both the first surface 190 and the second surface 192 of the piezoelectric material 122 are covered by a plurality of partitioned surface electrodes 124 separated by a gap 128.

Figure 9D:
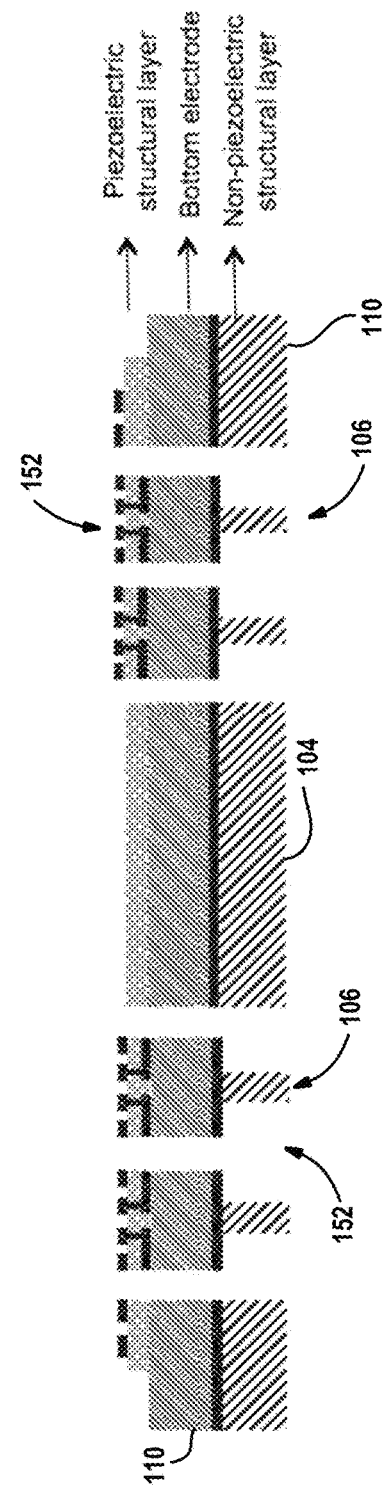

FIG. 8D depicts a connecting member 106 having a T-shape cross-section 152 and a unimorph structure 146. FIG. 9D depicts a multi-axis transducer 100 having the connecting member 106 as depicted in FIG. 8D. Specifically, FIG. 8D depicts a connecting member 106 having a piezoelectric material 122 with a first surface 190 and an opposing a second surface 192, wherein the first surface is covered by a plurality of partitioned surface electrodes 124 separated by a gap 128. The second surface 192 of the piezoelectric material 122 is covered by a single surface electrode 126 having a first surface 196 of the single surface electrode 126 opposing a second surface 198 of the single surface electrode. The second surface 192 of the piezoelectric material 122 faces the first surface 196 of the single surface electrode 126. A non-piezoelectric material 130 faces the second surface 198 of the single surface electrode 126. The width of the non-piezoelectric material 130 is less than the width of the piezoelectric material 122, so that a T-shape is formed.

FIG. 8E depicts a connecting member 106 having a T-shape 152 and a single piezoelectric material 122. The piezoelectric material 122 has a first surface 190 and an opposing a second surface 192. Both the first surface 190 and the second surface 192 of the piezoelectric material 122 are covered by a plurality of partitioned surface electrodes 124. The plurality of partitioned surface electrodes 124 covering the first surface of the piezoelectric material 122 are separated by a gap 128.

FIG. 8F depicts a connecting member 106 having a T-shape 152 and a single piezoelectric material 122. The piezoelectric material 122 has a first surface 190 and an opposing a second surface 192. The first surface 190 of the piezoelectric material 122 is covered by a single surface electrode 126. The second surface 192 of the piezoelectric material 122 is covered by a plurality of partitioned surface electrodes 124.

The connecting members 106 of the multi-axis transducer 100 allows the moveable section, form of either the platform 104 or primary frame 110, to have motional flexibility in all three dimensions. The moveable section can be selectively actuated in any of a X, Y, or Z direction, or in a combination of those directions by exciting different voltage polarities on the partitioned surface electrodes 124 and straining the connecting members 106. The motion of each connecting members 106 is coupled to the plurality of connecting members 106 through physical connecting to the same primary frame 110 or platform 104. Different excitation schemes can be applied to the connecting members 106 to create different types of motion in any of the three geometrical axes. Similarly, an external mechanical stimulus will excite the inertial motion of the moveable section with respect to the fixed or anchor section, which will create bending strain on the connecting members 106. Depending on the direction of motion, the partitioned surface electrodes 124 will provide different polarities and amplitudes of electrical charge to an external circuit. The collected charges from the partitioned surface electrodes 124 can be either used to harvest electrical energy or to calculate (sense) the direction and amplitude of the applied mechanical motion.

As shown in FIG. 10A-F, when the platform 104 moves due to an ambient mechanical vibration in any three dimensions, the connecting members 106 are bent such that both compressive stress and tensile stress are formed simultaneously at different sections of the piezoelectric material 122. Thus, both positive and negative electrical charges are generated simultaneously on the first surface 190 of the piezoelectric material 122 with respect to the single surface electrode 126. If a single surface electrode 126 is used to cover the entire first surface 190 of the piezoelectric material 122, charge cancellation will occur and the overall harvested power output will be minimal, if not zero.

Figure 10C:
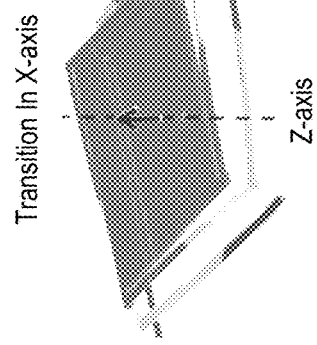
Figure 10B:
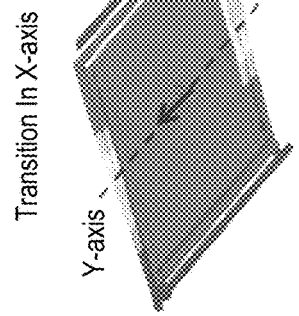
Figure 10A:
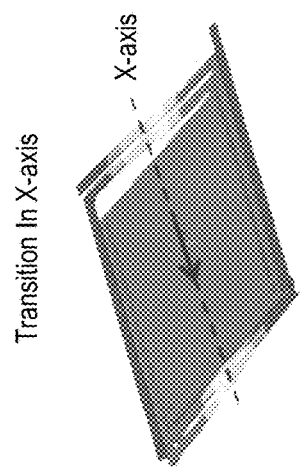

FIG. 10A depicts an exemplary multi-axis piezoelectric vibration energy harvester experiencing translational movement about the X-axis. FIG. 10B depicts an exemplary multi-axis piezoelectric vibration energy harvester experiencing translational movement about the Y-axis. FIG. 10C depicts an exemplary multi-axis piezoelectric vibration energy harvester experiencing translational movement about the Z-axis.

Figure 10F:
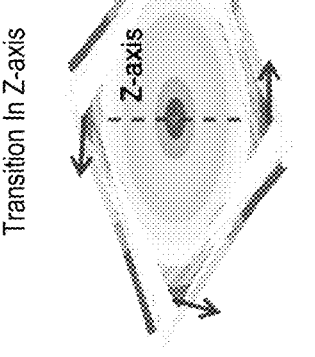
Figure 10E:
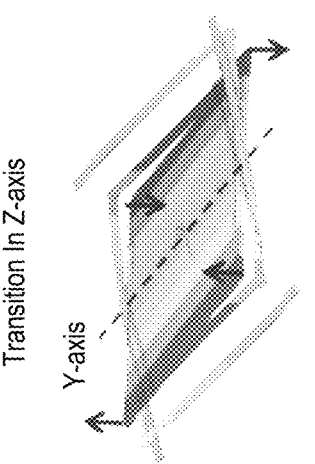
Figure 10D:
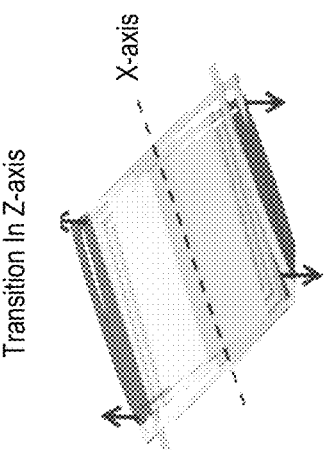

FIG. 10D depicts an exemplary multi-axis piezoelectric vibration energy harvester experiencing rotational movement about the X-axis. FIG. 10E depicts an exemplary multi-axis piezoelectric vibration energy harvester experiencing rotational movement about the Y-axis. FIG. 10F depicts an exemplary multi-axis piezoelectric vibration energy harvester experiencing rotational movement about the Z-axis.

As shown in FIG. 11A-F, the partitioned surface electrodes 124 covering the first surface 190 of the piezoelectric material 122 allow generated electrical charges with opposite polarities to be collected simultaneously and efficiently. In this instance, the connecting member 106 has four partitioned surface electrodes 124. However, the in-plane (X-Y-axes) bending of a connecting member 106 creates varying amounts of surface charge from the center of the connecting member 106 to its lateral edge causing some efficiency loss due to averaging out of the electrical potential underneath each electrode. To further increase efficiency, the number of partitioned surface electrodes 124 should be increased. The power management electronics will increase in complexity due to the increased number of output.

FIG. 11A depicts the voltage polarities on the partitioned surface electrodes with respect to the common ground electrode in an exemplary multi-axis piezoelectric transducer when there is titling movement about the X-axis. FIG. 11B depicts the voltage polarities on the partitioned surface electrodes with respect to the common ground electrode in an exemplary multi-axis piezoelectric transducer when there is titling movement about the Y-axis. FIG. 11C depicts the voltage polarities on the partitioned surface electrodes with respect to the common ground electrode in an exemplary multi-axis piezoelectric transducer when there is titling movement about the Z-axis.

FIG. 11D depicts the voltage polarities on the partitioned surface electrodes with respect to the common ground electrode in an exemplary multi-axis piezoelectric transducer when there is translational movement about the X-axis. FIG. 11E depicts the voltage polarities on the partitioned surface electrodes with respect to the common ground electrode in an exemplary multi-axis piezoelectric transducer when there is translational movement about the Y-axis. FIG. 11F depicts the voltage polarities on the partitioned surface electrodes with respect to the common ground electrode in an exemplary multi-axis piezoelectric transducer when there is translational movement about the Z-axis.

With respect to FIGS. 12A-I an exemplary method of fabrication for the described multi-axis transducer 100 is shown. The multi-axis transducer 100 may be fabricated in a meso-scale size (a scale of several centimeters to a few millimeters) from bulk piezoelectric ceramics (piezoelectric sheets with thickness greater than 100 micrometers).

Figure 12A:
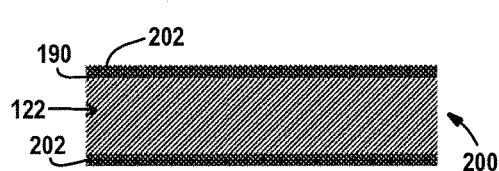
Figure 12F:
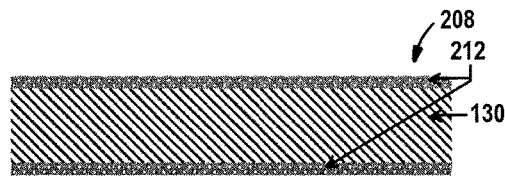
Figure 12B:
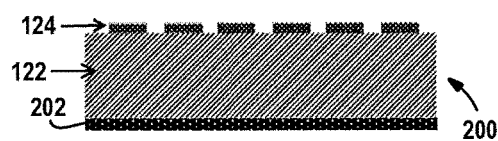
Figure 12G:
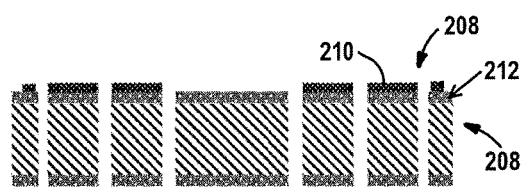
Figure 12C:
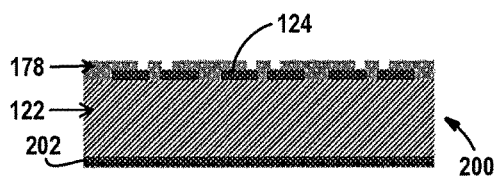
Figure 12H:
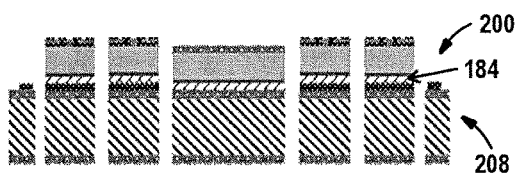
Figure 12D:
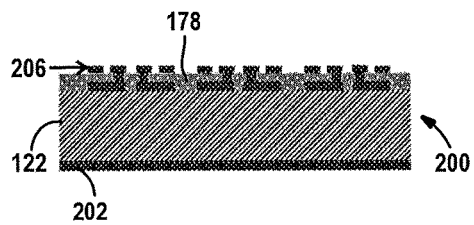

In FIGS. 12A-E, a first member 200 is formed. In FIG. 12A, a first set of metal layer 202 is deposited on a first surface 190 of a polished bulk piezoelectric material 122. In FIG. 12B, the first set of metal layer 202 is patterned to form the partitioned surface electrodes 124 used for energy transduction. In FIG. 12C, an electrical isolation layer 178 (such as parylene, silicon oxide, silicon nitride, etc.) is deposited and patterned on top of the first set of metal layers 202. In FIG. 12D, a second set of metal layers 206 is deposited and patterned on the electrical isolation layer 178 to form individual electrical connections to the partitioned surface electrodes 124 underneath. The composition and size of the first set of metal layers 202 and the second set of metal layers 206 may correspond to or vary from one another.

Figure 12I:
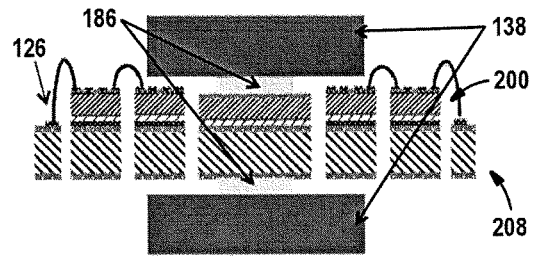
Figure 12E:
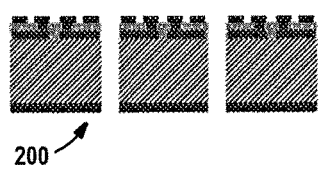

In FIG. 12E, the first member 200 is patterned to form the piezoelectric parts of the transducer, including the suspension beams and the center platform. The patterning of the piezoelectric material 122 may be done to form individual parts to be assembled together later on, such as dicing of individual rectangular connecting members 106. Alternatively, the patterning of the first member 200 may be done to form a whole connected structure with connecting members 106 and platform 104 already attached together, such as by laser machining or milling.

In FIGS. 12F-G, a second member 208 is formed. The second member 208 may be formed of either a piezoelectric material 122 or a non-piezoelectric material 130. In FIG. 12F, an insulation layer 212 is deposited on the second member 208. The insulation layer 212 may be the same or different from the electrical isolation layer 178. For example, a thin-film deposited silicon oxide, silicon nitride, parylene, or other polymer material for electrical insulation.

In FIG. 12G, a third metal layer 210 is deposited and patterned on this second member 208 to form the single surface electrode 126. Prior to the first member 200 being bonded to the second member 208 and after the third metal layer 210 is deposited and patterned, the second member 208 is patterned to form the harvester structure, including the connecting members 106, the platform 104, and the primary frame 110.

In FIG. 12H, the first member 200 and the second member 208 are aligned and bonded via a bonding layer 184. The third metal layer 210 may form the bonding layer 184. Alternatively, the bonding layer 184 may be a conductive adhesive.

In FIG. 12I, additional members 138 may be attached to the connecting members 106 and electrical connections may be integrated on the connecting members 106. For example, a vibration energy harvester requires a large inertial mass in order to efficiently couple the ambient mechanical energy into the transducer. Two similarly sized proof-masses may be attached to the top and bottom sides of the moveable section (the platform 104 or the primary frame 110). Spacers 186 may be placed between the platform 104 and a proof mass to create sufficient vertical gap between the mechanical springs and the proof mass. The lateral sizes of the proof mass may extend from the center platform to the primary frame 110. The two proof-masses may prevent unbalanced motions resulting from unequal weight distribution. For instance, without this measure, a translational vibration input along X-axis may also create tilting motion around Y-axis because the centroid of the proof mass would not be located at the center of the moveable section.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A multi-axis transducer, comprising:
    a stationary member;
    at least two connecting members, each connecting member attached at one location thereof to one of the stationary member or a second connecting member and, in response to a stimuli, is free to move along any of three geometric axes that are perpendicular to each other; and
    two or more energy-conversion elements disposed on each connecting member, each energy-conversion element operates to convert motion of the connecting member to electrical energy or vice versa,
    wherein a common geometric plane passes through each of the at least two connecting members and the stationary member, and the two largest dimensions of one of the at least two connecting members defines a geometric plane that is parallel with the common geometric plane.

2. The multi-axis transducer of claim 1, wherein each connecting member has a T-shaped cross-section as taken along a plane transverse to the common geometric plane.

3. The multi-axis transducer of claim 1, wherein one or more of the connecting members have a L-shape or a U-shape structure.

4. The multi-axis transducer of claim 1, wherein the connecting members has a unimorph structure containing at least one active layer and at least one passive layer.

5. The multi-axis transducer of claim 1, wherein the connecting members has a bimorph structure containing at least two active layers.

6. A three-axis transducer, comprising:
    a mass;
    a frame defining an inner space in which the mass is disposed; and
    a plurality of connecting members disposed within the inner space and arranged around the mass, wherein each connecting member
        in response to stimuli, allows for linear movement of a moveable section formed of one of the mass and the frame in any of three geometric axes that are perpendicular to each other,
        has a first end and a second end, the first end being attached to the mass,
        is elastic,
        includes a piezoelectric element having a first surface and a second surface, and
        has a plurality of surface electrodes disposed on at least the first surface of each piezoelectric element,
    wherein a common geometric plane passes through each of the plurality of connecting members, the frame, and the mass, and the two largest dimensions of one of the plurality of connecting members defines a geometric plane parallel to the common geometric plane.

7. The three-axis transducer of claim 6, wherein the plurality of partitioned surface electrodes contain a first group of partitioned surface electrodes and a second group of partitioned surface electrodes,
    the first group of partitioned surface electrodes completing one of harvesting electrical energy resulting from mechanical motion of the moveable section, sensing the motion of the plurality of connecting members or the moveable section by collecting charge, and applying voltage to actuate the moveable section, and
    the second group of partitioned surface electrodes completing one of harvesting electrical energy resulting from mechanical motion of the moveable section, sensing the motion of the plurality of connecting members or the moveable section by collecting charge, and applying voltage to actuate the moveable section that differs from the first group of partitioned surface electrodes.

8. The three-axis transducer of claim 6, wherein the plurality of connecting members respond to stress or strain on at least one of the plurality of the connecting members resulting from a mechanical or electrical stimuli.

9. The three-axis transducer of claim 6, wherein the mass, the frame, and the plurality of connecting members are arranged in a monolithic device.

10. The three-axis transducer of claim 6, wherein the plurality of connecting members are symmetrically arranged around the mass.

11. The three-axis transducer of claim 6, further comprising:
    a stationary casing, wherein
        one of the mass or the frame is coupled to the stationary casing,
        the one of the mass or the frame coupled to the stationary casing is fixed and forms an anchor section, and
        the one of the mass or the frame not coupled to the stationary casing forms the moveable section that is free to move in any of three geometric axes that are perpendicular to each other.

12. The three-axis transducer of claim 6, further comprising:
    one or more additional structures attached or monolithically integrated on at least one of the mass and the frame, wherein at least one or more of the additional structures increases the inertial mass of the moveable section and decreases the mechanical resonance frequency of the transducer.

13. The three-axis transducer of claim 6, further comprising:
    one or more additional structures attached or monolithically integrated on the moveable section, wherein one or more of the additional structures is a sensor, an actuator, an energy reservoir, or an electronic device.

14. The three-axis transducer of claim 6, further comprising:
    a secondary moveable frame disposed within the inner space, wherein
    a first set of connecting members couples the mass to the secondary moveable frame, and
    a second set of connecting members couples the secondary moveable frame to the primary frame.

15. The three-axis transducer of claim 6, wherein each connecting member is a rectangular cuboid.

16. The three-axis transducer of claim 6, wherein each connecting member has a T-shaped cross-section as taken along a plane transverse to the common geometric plane.

17. The three-axis transducer of claim 6, wherein each connecting member further comprises:
a second element including one of a second piezoelectric element or a non-piezoelectric element,
wherein a width of the piezoelectric element is at least twice a width of the second element.

18. The three-axis transducer of claim 6, wherein one or more of the plurality of connecting members have a L-shape or a U-shape structure.

19. The three-axis transducer of claim 6, wherein four surface electrodes are disposed on the first surface of the piezoelectric element.

20. The three-axis transducer of claim 6, wherein at least one of the plurality of surface electrodes is electrically excited, wherein the at least one electrically excited surface electrode creates mechanical stress on the transducer to change the mechanical resonance frequency of the transducer.

21. The three-axis transducer of claim 6, wherein each connecting member further comprises:
a ground electrode, wherein
the ground electrode has a first surface opposing a second surface, and
the first surface faces the second surface of the piezoelectric element.

22. The three-axis transducer of claim 21, wherein each connecting member further comprises:
a non-piezoelectric element facing the second surface of the ground electrode.

23. The three-axis transducer of claim 21, wherein each connecting member further comprises:
a second piezoelectric element facing the second surface of the ground electrode.

24. A three-axis piezoelectric transducer, comprising:
a platform;
a primary frame defining an inner space in which the platform is disposed;
a plurality of beams disposed within the inner space and attaching the platform to the primary frame, wherein each beam
is formed of at least one piezoelectric element,
has a plurality of partitioned surface electrodes disposed on at least one surface of the beam, wherein
the plurality of partitioned surface electrodes contain a first group of partitioned surface electrodes and a second group of partitioned surface electrodes,
the first group of partitioned surface electrodes completing one of harvesting electrical energy resulting from mechanical motion of a moveable section, sensing the motion of the plurality of beams or the moveable section by collecting charge, and applying voltage to actuate the moveable section, and
the second group of partitioned surface electrodes completing one of harvesting electrical energy resulting from mechanical motion of a moveable section, sensing the motion of the plurality of beams or the moveable section by collecting charge, and applying voltage to actuate the moveable section that is differs from the first group of partitioned surface electrodes; and
a stationary casing, wherein
one of the platform or the primary frame is attached to the stationary casing and fixed in place to form an anchor section, and
the one of the platform or the primary frame not attached to the stationary casing forms the moveable section, wherein
the moveable section, in response to stress or strain on at least one of the plurality of the beams resulting from a mechanical or electrical stimuli, is free to move in any of three geometric axes that are perpendicular to each other,
wherein a common geometric plane passes through each of the plurality of beams, the primary frame, and the platform, and the two largest dimensions of one of the plurality of beams define a geometric plane parallel to the common geometric plane.

25. The three-axis piezoelectric transducer of claim 24, wherein one or more of the plurality of beams have a L-shaped or U-shaped structure allowing for motional flexibility of the moveable section in multiple axes and amplification of the motional displacement of the moveable element.

26. The three-axis piezoelectric transducer of claim 24, wherein each beam, further comprises:
a ground electrode covering at least one side of the beam, wherein the ground electrode acts as an electrical ground.

27. The three-axis piezoelectric transducer of claim 24, wherein each beam further comprises:
one or more non-piezoelectric elements adjacent the ground electrode.

28. The three-axis piezoelectric transducer of claim 24, wherein each beam has a T-shaped cross-section as taken along a plane transverse to the common geometric plane.

29. The three-axis transducer of claim 24, further comprising:
an interface circuitry, wherein the interface circuitry connects to at least one of the partitioned surface electrodes allowing for the harvesting of electrical energy, detection of an output signal, or application of an excitation signal.

30. The three-axis transducer of claim 24, wherein each mechanical springs further comprises:
a plurality of piezoresistive sensing elements, wherein the piezoresistive sensing elements measure the amplitude, frequency, or phase of the motion of each beam of the multiple of piezoelectric beams or the moveable section.

31. The three-axis piezoelectric transducer of claim 24, further comprising:
a set of additional electrodes integrated on either the surface of one or more of the multiple of piezoelectric beams or the moveable section; and
a set of external electrodes integrated on a neighboring stationary plate,
wherein an inertial motion of the moveable section is determined by measuring a capacitance change between the set of additional electrodes and the set of external electrodes.

32. The three-axis piezoelectric transducer of claim 24, further comprising:
one or more additional structures attached or monolithically integrated on the moveable section, wherein at least one or more of the additional structures increases the inertial mass of the moveable section and decreases the mechanical resonance frequency of the multi-axis transducer.

33. The three-axis piezoelectric transducer of claim 24, further comprising:
   one or more additional structures attached or monolithically integrated on the moveable section, wherein one or more of the additional structures is a sensor, an actuator, an energy reservoir, or an electronic device.

\* \* \* \* \*